(12) United States Patent
Stillwagon

(10) Patent No.: US 9,156,140 B2
(45) Date of Patent: Oct. 13, 2015

(54) METER PULLER WITH SAFETY SHIELD

(75) Inventor: James R. Stillwagon, Columbus, OH (US)

(73) Assignee: Kilvert, LLC, Dublin, OH (US)

( * ) Notice: Subject to any disclaimer, the term of this patent is extended or adjusted under 35 U.S.C. 154(b) by 939 days.

(21) Appl. No.: 13/354,034

(22) Filed: Jan. 19, 2012

(65) Prior Publication Data

US 2012/0110830 A1    May 10, 2012

Related U.S. Application Data

(63) Continuation-in-part of application No. 12/779,577, filed on May 13, 2010, now abandoned.

(51) Int. Cl.
| | |
|---|---|
| *B23P 19/00* | (2006.01) |
| *H01R 43/00* | (2006.01) |
| *B25B 9/00* | (2006.01) |
| *B25B 27/00* | (2006.01) |
| *B25B 27/02* | (2006.01) |
| *B25B 27/14* | (2006.01) |

(52) U.S. Cl.
CPC . *B25B 9/00* (2013.01); *B25B 27/00* (2013.01); *B25B 27/02* (2013.01); *B25B 27/14* (2013.01); *Y10T 29/49002* (2015.01)

(58) Field of Classification Search
CPC ........ B25B 27/00; B25B 27/14; B25B 27/02; B25B 9/00; G01R 11/04; Y10T 29/53283; Y10T 29/49822
See application file for complete search history.

(56) References Cited

U.S. PATENT DOCUMENTS

| | | | | |
|---|---|---|---|---|
| 3,044,158 A | * | 7/1962 | Bushuell | 29/278 |
| 3,197,848 A | * | 8/1965 | Eichacker | 29/758 |
| 3,570,103 A | | 3/1971 | Price | |
| 3,934,326 A | * | 1/1976 | Owen et al. | 29/278 |
| 4,122,599 A | * | 10/1978 | Lunycz | 29/758 |
| 4,450,504 A | * | 5/1984 | Severson | 361/664 |
| 4,907,334 A | * | 3/1990 | Carver | 29/278 |
| 5,097,581 A | * | 3/1992 | Williams et al. | 29/278 |
| 5,444,907 A | * | 8/1995 | Becker | 29/764 |
| 6,679,723 B1 | * | 1/2004 | Robinson | 439/483 |
| 6,823,563 B2 | * | 11/2004 | Robinson et al. | 16/422 |
| 2003/0015330 A1 | * | 1/2003 | Wood et al. | 174/5 R |
| 2011/0277294 A1 | * | 11/2011 | Stillwagon | 29/426.5 |

OTHER PUBLICATIONS

Utility Solutions Catalog Cover and Meter Grabber pages, 3 pages, revised Sep. 2007.
Internet Archive Page of Utility Solutions Web Page, Metering Tools, 1 page, publicly available as of Apr. 9, 2008.
Internet Archive Page of Utility Solutions Web Page, 1 page, publicly available as of Mar. 29, 2009.
Internet Archive Page of Utility Solutions Web Page, Meter Grabber, 2 pages, publicly available as of May 7, 2010.
Gary Guard Advertisement, 5 pages, document is undated but it is believed the document is older than May 13, 2010.

* cited by examiner

*Primary Examiner* — Peter DungBa Vo
*Assistant Examiner* — Jeffrey T Carley
(74) *Attorney, Agent, or Firm* — Sand & Sebolt

(57) ABSTRACT

A tool for installing and removing an electrical power meter comprising a sleeve member adapted for sliding movement about the meter and having a first end opposite a second end, a plurality of releasable gripping hooks mounted on the first end of the sleeve member for selectively engaging the meter, an attaching hook member extending outwardly from the first end of the sleeve member, and a shield secured to the second end of the sleeve member.

10 Claims, 21 Drawing Sheets

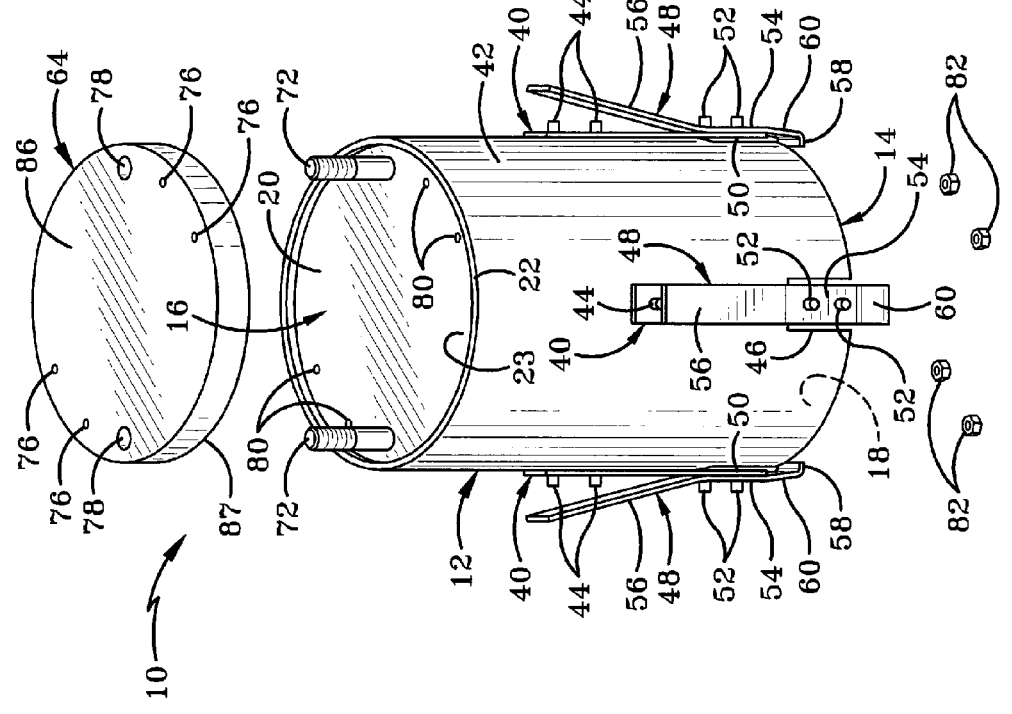

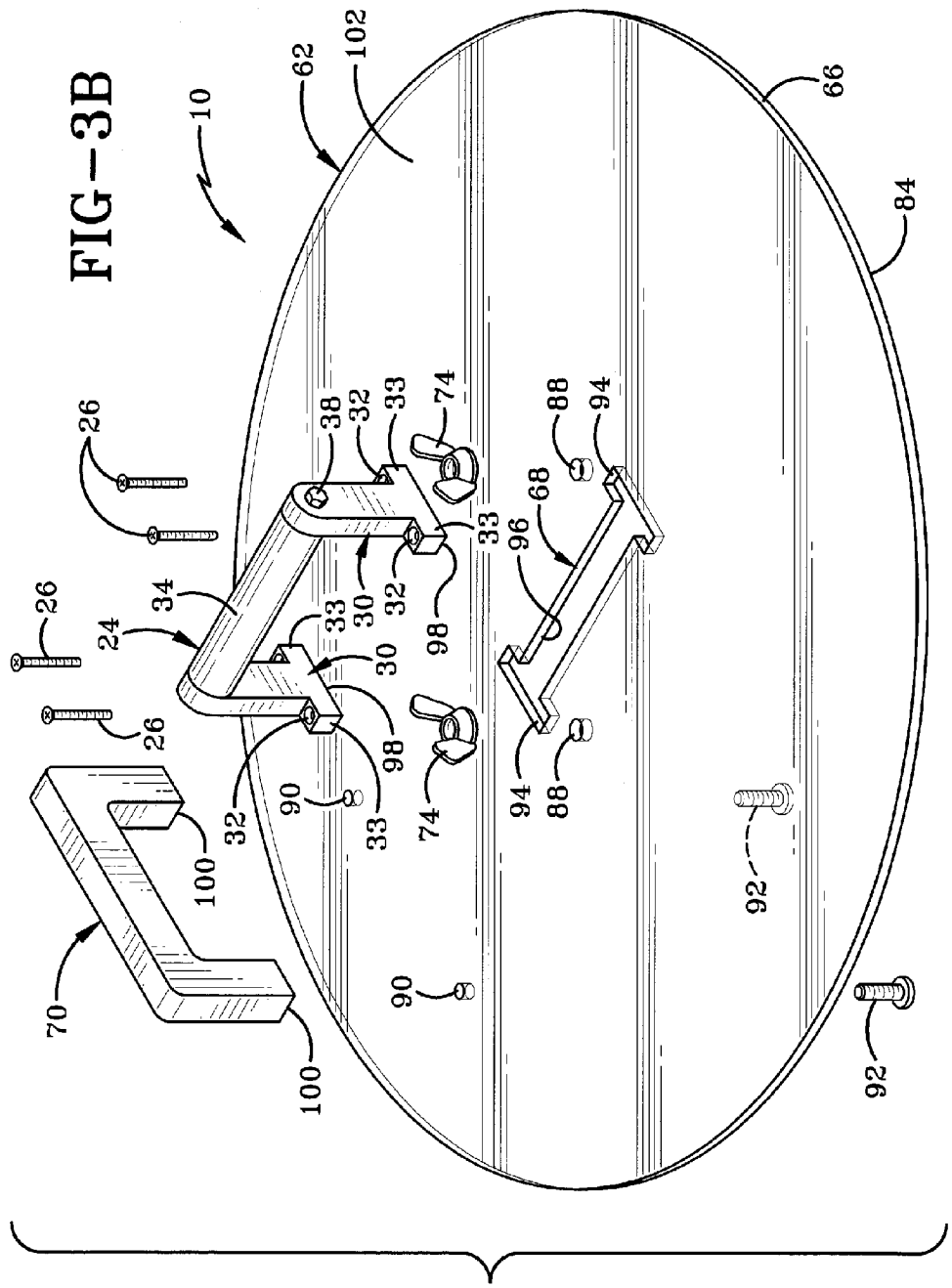

METER PULLER WITH SAFETY SHIELD

CROSS-REFERENCE TO RELATED APPLICATION

This application is a continuation-in-part of U.S. patent application Ser. No. 12/779,577, filed May 13, 2010; the disclosure of which is incorporated herein by reference.

BACKGROUND OF THE INVENTION

1. Technical Field

The invention relates generally to a tool for installing and removing electrical power meters. More particularly, the invention relates to a tool with a shield for removing electrical power meters. Specifically, the invention relates to a tool with a removable shield that can be used to protect a user while installing and removing electrical power meters.

2. Background Information

Electrical power meters must be occasionally removed and installed on electrical power distribution boxes or housings. The electrical meters can be removed by hand but there is a great deal of danger due to the high current, risk of electrocution, and electrical arc explosion that creates arc thermal energy and a pressure wave and fragmentation.

U.S. Pat. No. 5,097,581 is directed to an electrical power meter installing/removing apparatus that fits around the perimeter of the meter base and locks in place with snapping tabs. The operator then pulls back on the tool and removes the meter from the distribution box. While the apparatus includes a handle proximate the back end of the tool, the tool does not protect the user from electrocution or explosion which may occur at the connection between the power meter and the distribution box when the meter is removed.

SUMMARY OF THE INVENTION

The present invention broadly comprises a tool for installing and removing an electrical power meter comprising a sleeve member adapted for sliding movement about the meter and having a first end opposite a second end, a plurality of releasable gripping hooks mounted on the first end of the sleeve member for selectively engaging the meter, an attaching hook member extending outwardly from the first end of the sleeve member, and a shield secured to the second end of the sleeve member.

The present invention also broadly comprises a method of removing an electrical power meter comprising the steps of providing a sleeve member having a first end with a plurality of releasable gripping hooks and an actuating hook member extending outwardly from the first end of the sleeve member and a second end with a handle, mounting a shield with a handle on the sleeve member second end, sliding the sleeve member onto the power meter until the attaching hook members surround a power meter gripping collar, grasping the second end handle and the shield handle, and pulling the sleeve member handle and the shield member in a direction away from the power meter.

The present invention also broadly comprises a method of removing an electrical power meter comprising the steps of securing a shield to a meter puller, wherein a first side of the shield abuts the back end, and operating a clamping system of the meter puller from the safety of a second side of the shield.

BRIEF DESCRIPTION OF THE DRAWINGS

The preferred embodiment of the invention, illustrative of the best mode in which Applicants have contemplated applying the principles of the invention, are set forth in the following description and are shown in the drawings.

FIG. 3A is an exploded view of the sleeve member shown with an intermediate member and connecting fasteners;

FIG. 3B is an exploded view of the safety shield and handles;

DESCRIPTION OF THE PREFERRED EMBODIMENT

Figure 1:
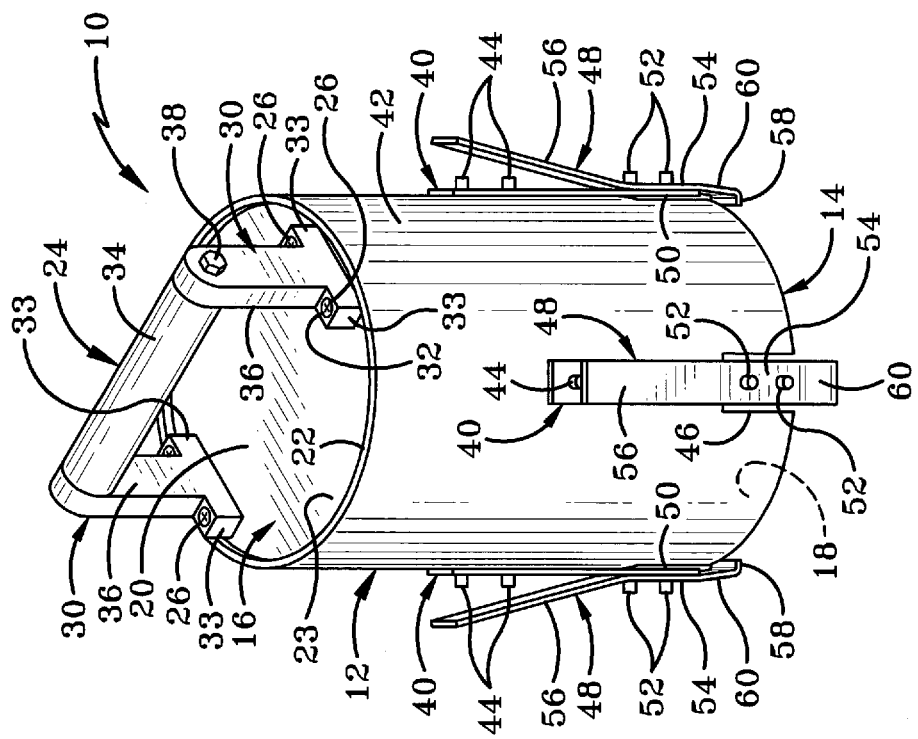
FIG. 1 is a perspective view of a sleeve member of a first embodiment of the invention with releasable gripping hooks and attaching hooks.

At the outset, it should be appreciated that like drawing numbers on different drawing views identify identical, or functionally similar, structural elements of the invention. While the present invention is described with respect to what is presently considered to be the preferred embodiment, it is to be understood that the invention as claimed is not limited to the disclosed aspects.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

The tool of the present invention is indicated generally at 10, and is particularly shown in FIGS. 1 through 9. As particularly shown in FIG. 1, a sleeve member 12 includes a first end 14 opposing a second end 16. First end 14 includes an opening 18, while top end 16 is enclosed by a top surface 20. Further, top surface 20 is recessed within a lip portion 22 of sleeve member 12 which defines a cavity 23.

A handle 24 is connected to second end 16 through fasteners 26 and holes 28 (not shown in FIG. 1). Handle 24 generally consists of a pair of posts 30 having holes 32 on tabs 33 for receiving fasteners 26 and a central rod 34 disposed between inner surfaces 36 of post 30 and connected to the post with fasteners 38. Accordingly, handle 24 is removable by unscrewing fasteners 26.

Sleeve member 12 is preferably cylindrical in shape and formed of a rigid material such as plastic. In a preferred embodiment, four attachment hooks 40 are mounted on an outer surface 42 of sleeve member 12 with a pair of rivets 44. Attachment hooks 40 are preferably thin strips of metal which extend for approximately half of a length of the sleeve member and terminate proximate first end 14. Further, the width of the attachment hooks is preferably just smaller than guide opening 46 and first end 14.

A gripping hook 48 is secured to a terminal end 50 of attachment hook 40 with a pair of rivets 52 which may extend into guide opening 46. Gripping hooks 48 preferably include a flat portion 54 near the rivets and an angled portion 56 extending upward from the rivets to provide a lever arm for hook portion 58. Hook portion 58 is connected to flat portion 54 through lower angled portion 60. Hook portion 58 is preferably generally perpendicular to lower angled portion 60 so as to grip on to the power meter base. Further, angled portion 56 permits the hook portion 58 to be directed radially outward by compressing the angled portion 56 towards sleeve member outer surface 42.

Figure 2:
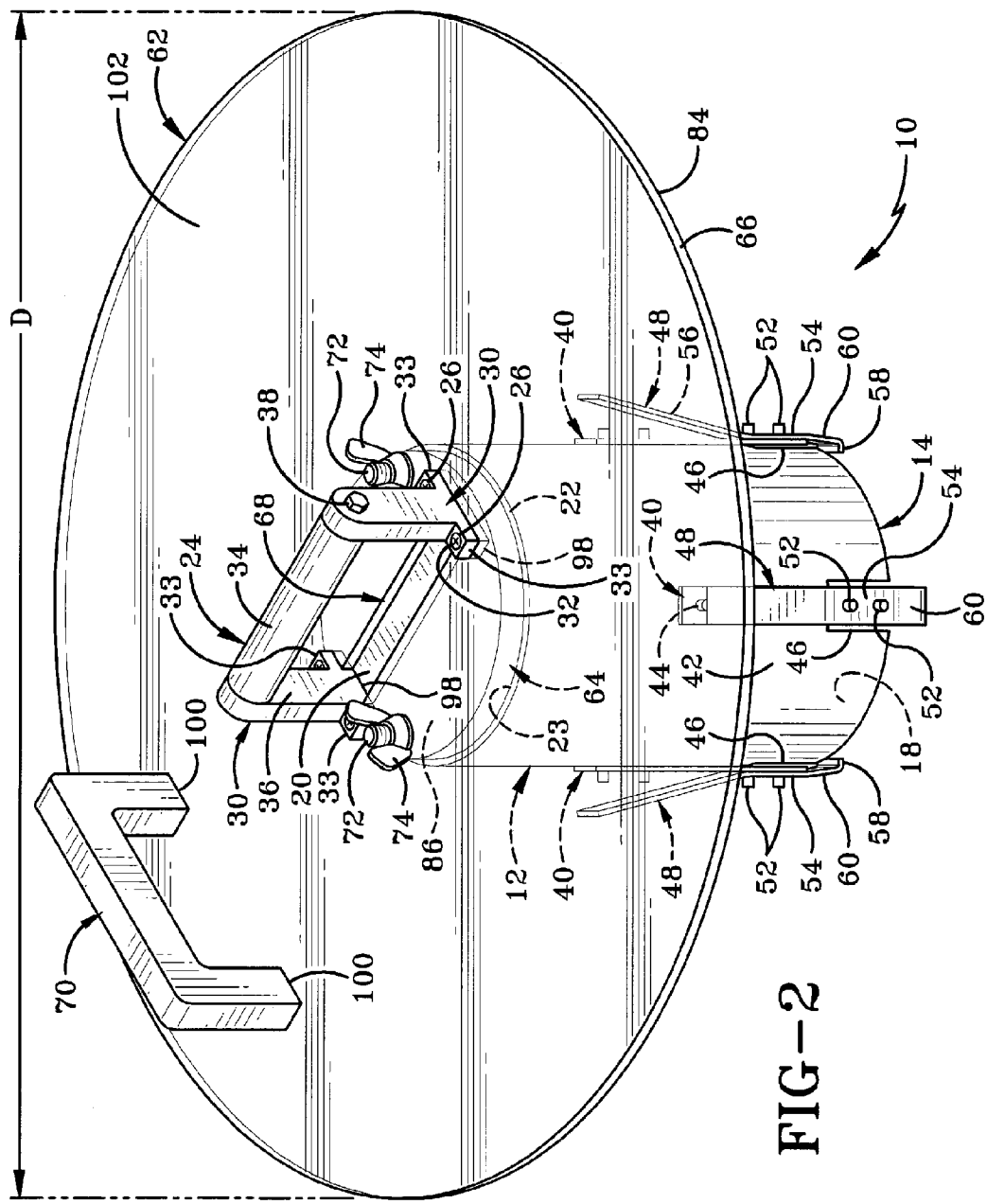
FIG. 2 is a perspective view of the sleeve member with a safety shield having a handle secured thereon.

Referring now to FIG. 2, sleeve member 12 is shown with a shield 62 connected to sleeve member 12. Further, an intermediate member 64 is located between shield 62 and sleeve member second end 16. Shield 62 includes an outer surface 66 and a central opening 68. Central opening 68 is preferably sized and shaped complimentary to handle 24 so that the shield can be installed vertically around handle 24 when the handle is secured to sleeve member second end 16. Further, shield 62 also includes a handle 70 arranged generally perpendicular to second end handle 24 to provide a comfortable orientation for the operator. Shield 62 rests atop intermediate member 64 and is secured to the intermediate member and the sleeve member with threaded studs 72 and fasteners 74. Finally, shield 62 is preferably sized to protect an operator and may range anywhere from the diameter of sleeve member second end 16 to well over 24 inches. However, in a preferred embodiment the shield diameter is approximately 18 inches to 24 inches and is particularly 24 inches in the preferred embodiment. Shield 62 is preferably composed of a clear rigid plastic material that is capable of withstanding electrocution and a significant impact. Shield 62 may also be composed of a flame retardant transparent polycarbonate shield or may include a plurality of shields stacked one atop of the other.

FIGS. 3A and 3B illustrate an exploded view of the first preferred embodiment tool 10. As can be particularly seen in FIG. 3A, intermediate member 64 is preferably cylindrical in shape and includes a plurality of holes 76 for receiving fasteners 26. A plurality of holes 78 permit threaded studs 72 to extend there through and secure shield 62 to sleeve member second end 16. Further, FIG. 3A illustrates a plurality of apertures 80 within second end 16 for receiving fasteners 26 of the handle as shown in FIG. 3B. Further, nuts 82 secure handle 24 and fasteners 26 to the intermediate member 64 and sleeve member 12. Intermediate member 64 is preferably cylindrical in shape and sized to fit within lip portion 22 of second end 16. Further, intermediate member 64 preferably has a thickness greater than the height of lip portion 22 to extend the shield contact surface above lip portion 22. Specifically, a bottom surface 84 of shield 62 contacts a top surface 86 of intermediate member above lip portion 22, while a bottom surface 87 of the intermediate member contacts top surface 20.

Referring specifically to FIG. 3B, safety shield 62 is shown with a pair of apertures 88 for receiving threaded studs 72 of second end 16. Shield 62 also includes a pair of apertures 90 for receiving fasteners 92 to connect handle 70 to shield 62. Further, central opening 68 is again shown complimentary shaped to handle 24 and includes a pair of rectangular openings 94 at each end and a slot 96 for permitting passage of handle central rod 34 during installation, while rectangular openings 94 permit passage of posts 30 during installation. Accordingly, a bottom surface 98 of post 30 rests flush with bottom surface 84 of shield 62 when fully installed, while a bottom surface 100 of handle 70 rests on a top surface 102 of the shield after installation. Therefore, handle 70 is preferably shorter than handle 24 to ensure that the handles are aligned at the same height. In a preferred embodiment, handle 70 is shorter than handle 24 by the same thickness as shield 62.

Figure 4:
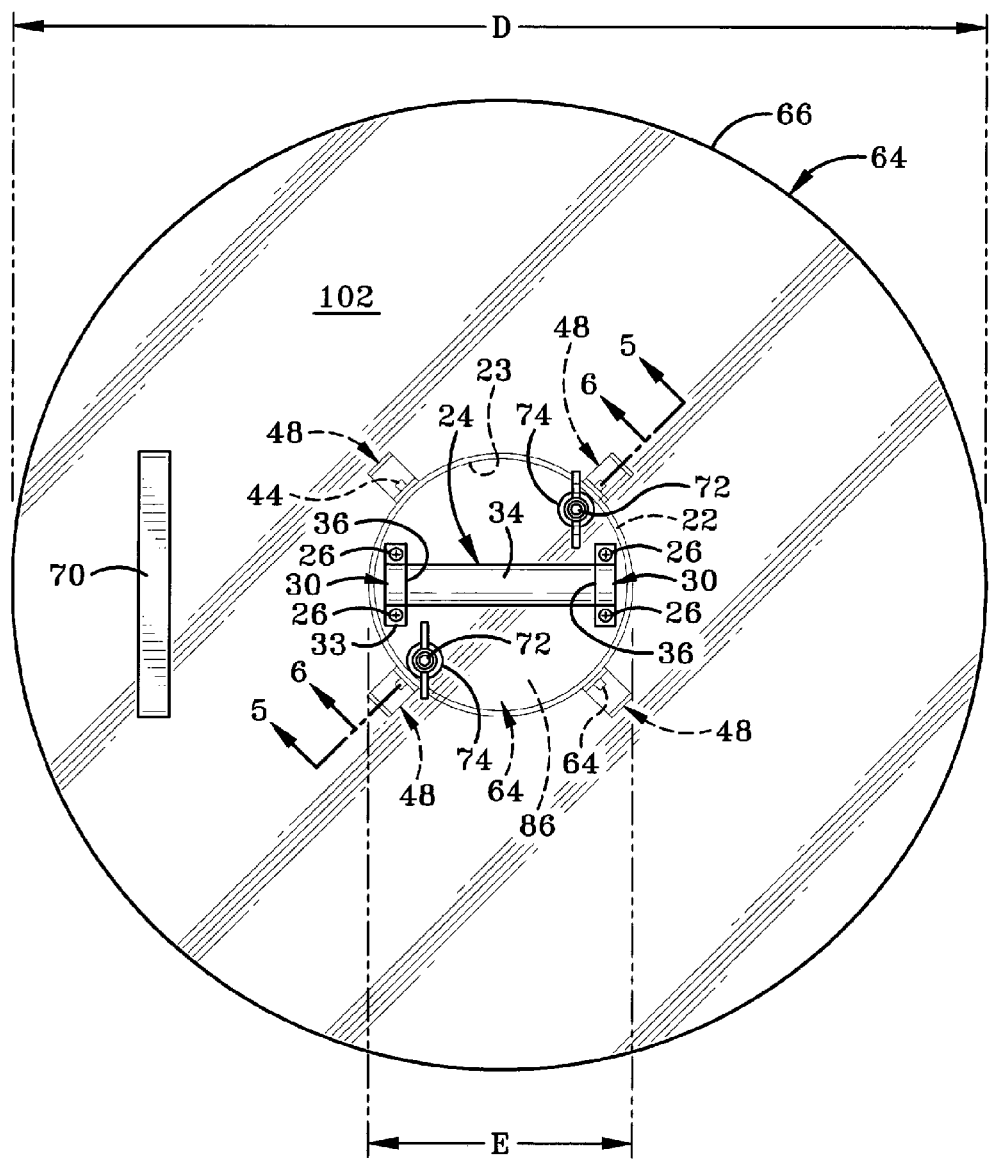
FIG. 4 is a top plan view of the safety shield secured to the sleeve member.
Figure 5:
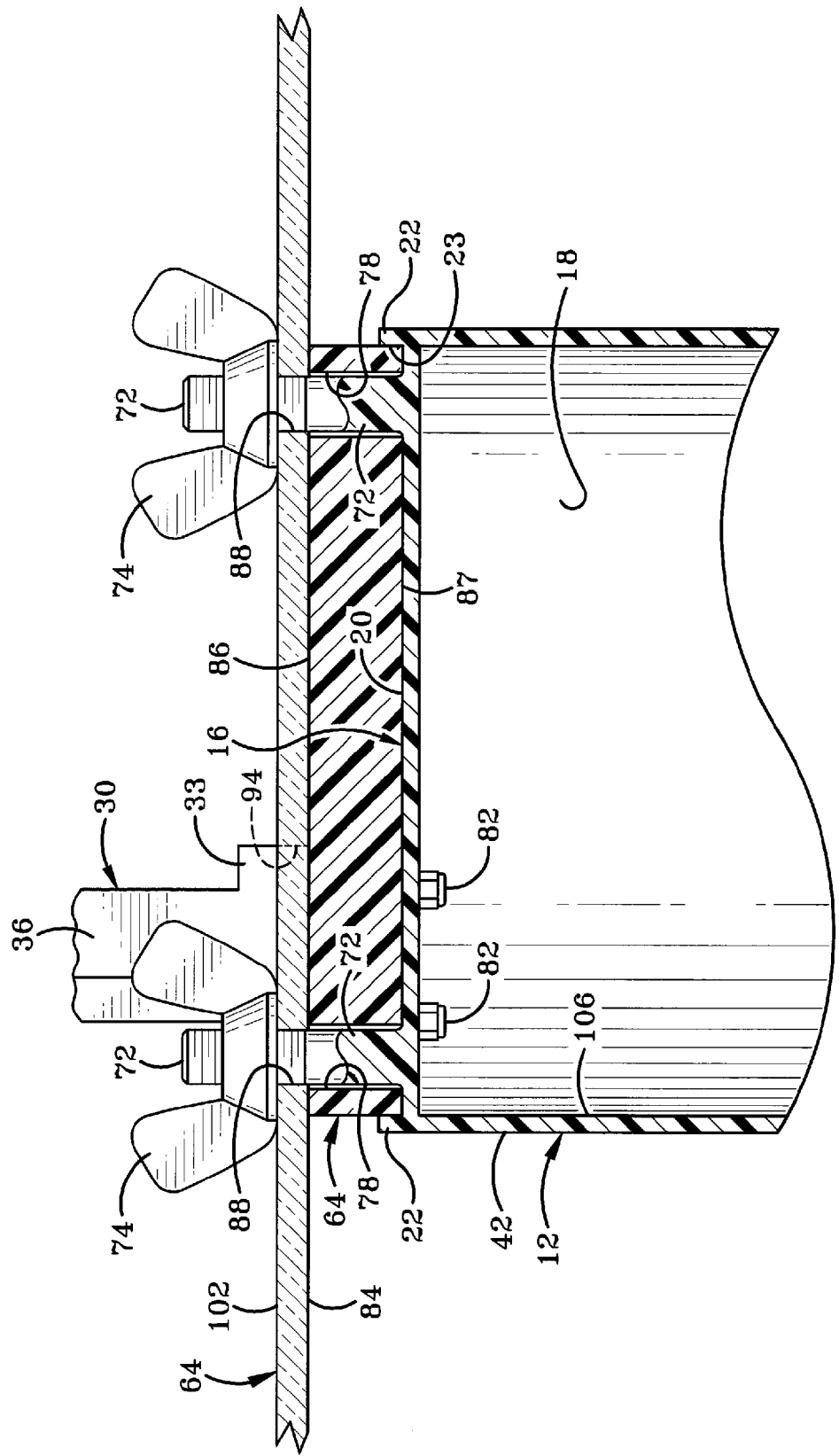
FIG. 5 is a partial cross-sectional view of the sleeve member and safety shield taken generally about Line 5-5 in FIG. 4.
Figure 6:
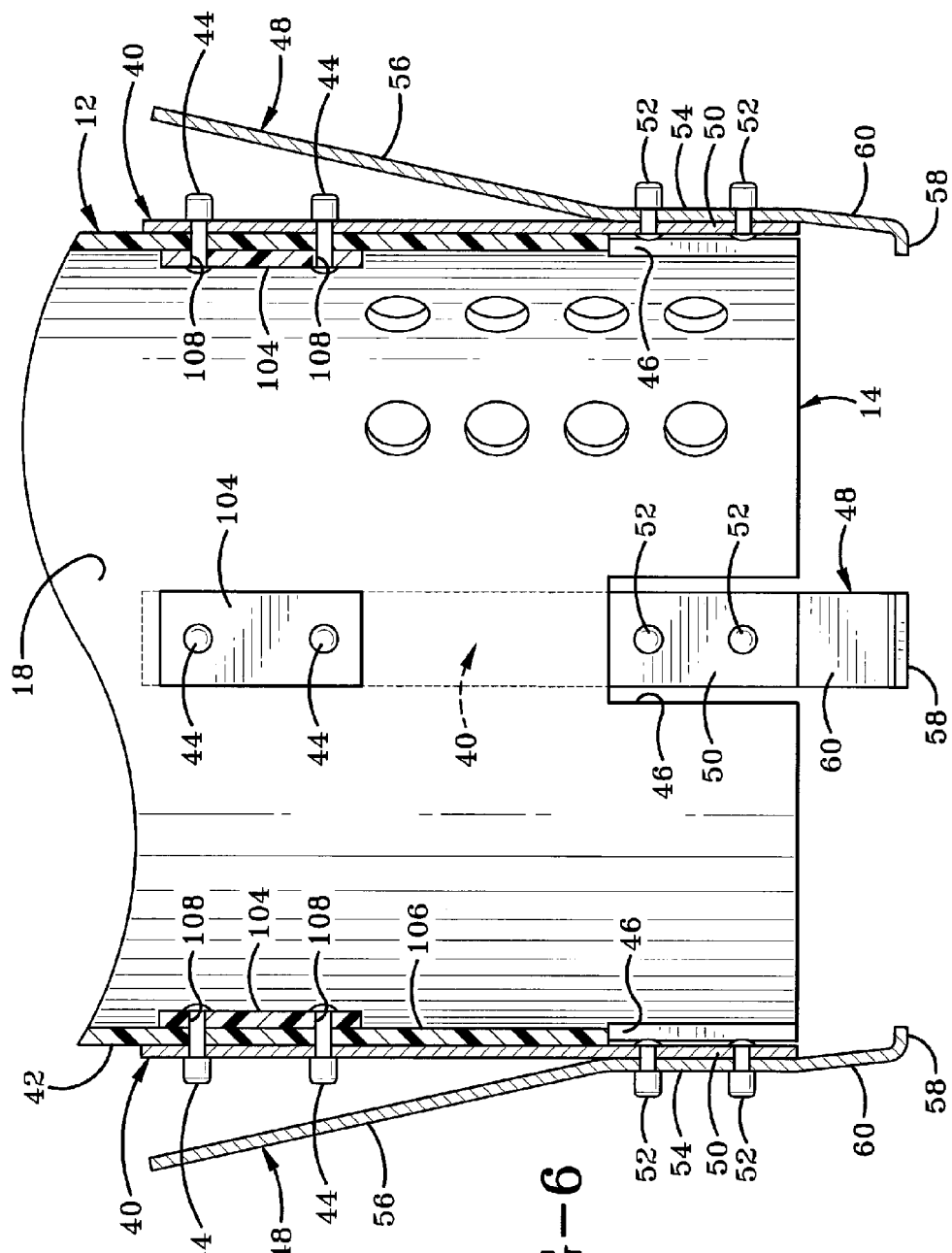
FIG. 6 is a partial cross-sectional view of the sleeve member taken generally about Line 6-6 in FIG. 4.

FIGS. 4, 5, and 6 illustrate the arrangement of the tool and shield components. As seen in FIG. 4, diameter D of shield 62 is preferably larger than diameter E of sleeve member 12. Further, the orientation of handle 24 with respect to handle 70 is seen in greater detail to allow the operator to more naturally use the meter puller and shield. Still further, this view illustrates the larger range of protection for the operator.

FIG. 5 illustrates a cross-sectional view showing second end 16 with studs 72 integral to the second end and intermediate member 64 surrounding the studs. FIG. 5 also illustrates opening 18 extending upward from first end 14 all the way to second end 16. Still further, this view illustrates lip portion 22 extending partially up the thickness of intermediate member 64 and intermediate member 64 extending far above lip portion 22. While studs 72 are shown integral to the second end, the stud could be removably secured to the second end with nuts.

FIG. 6 illustrates a cross-sectional view of first end 14 illustrating gripping hook 48 secured to outer surface 42 of sleeve member 12 with rivets 44. In addition, an absorbing mount 104 is located proximate an inner surface 106 of sleeve member 12. Absorbing mount 104 preferably includes a pair of apertures 108 arranged to receive rivets 44 and particularly mount attachment hook 40 to sleeve member 12. Absorbing mount 104 is preferably constructed of a rigid plastic but may also be constructed of a more flexible material and is useful to reduce the bending moment that is created by operating angle portion 56.

Having described the structure of the preferred embodiment, a preferred method of operation will be described in detail and should be read in light of FIGS. 1 through 9 and particularly FIGS. 7 through 9.

Figure 7:
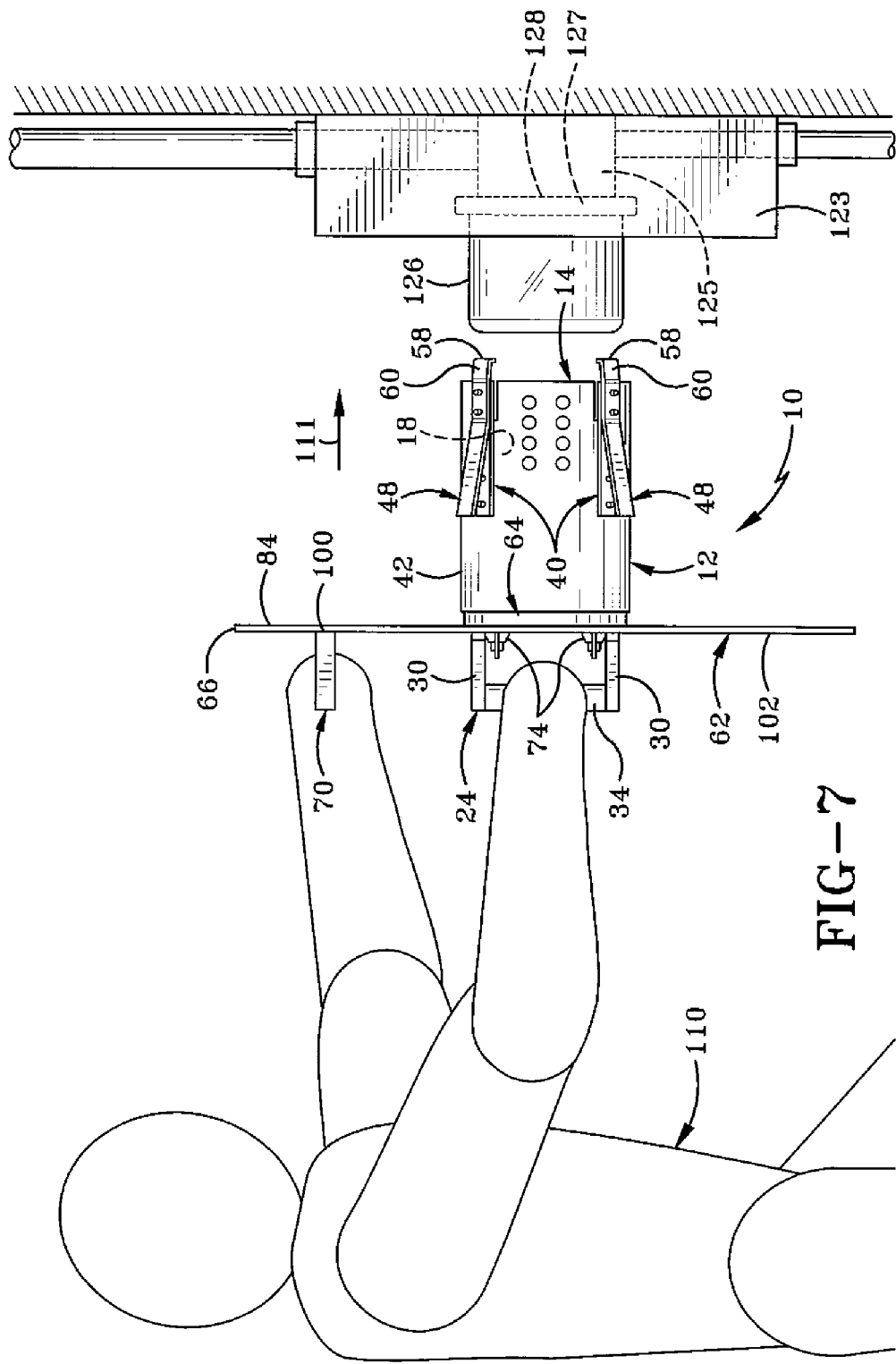
FIG. 7 is an operational view showing an operator gripping the handles and forcing the sleeve member and safety shield in the direction of a power meter.
Figure 8:
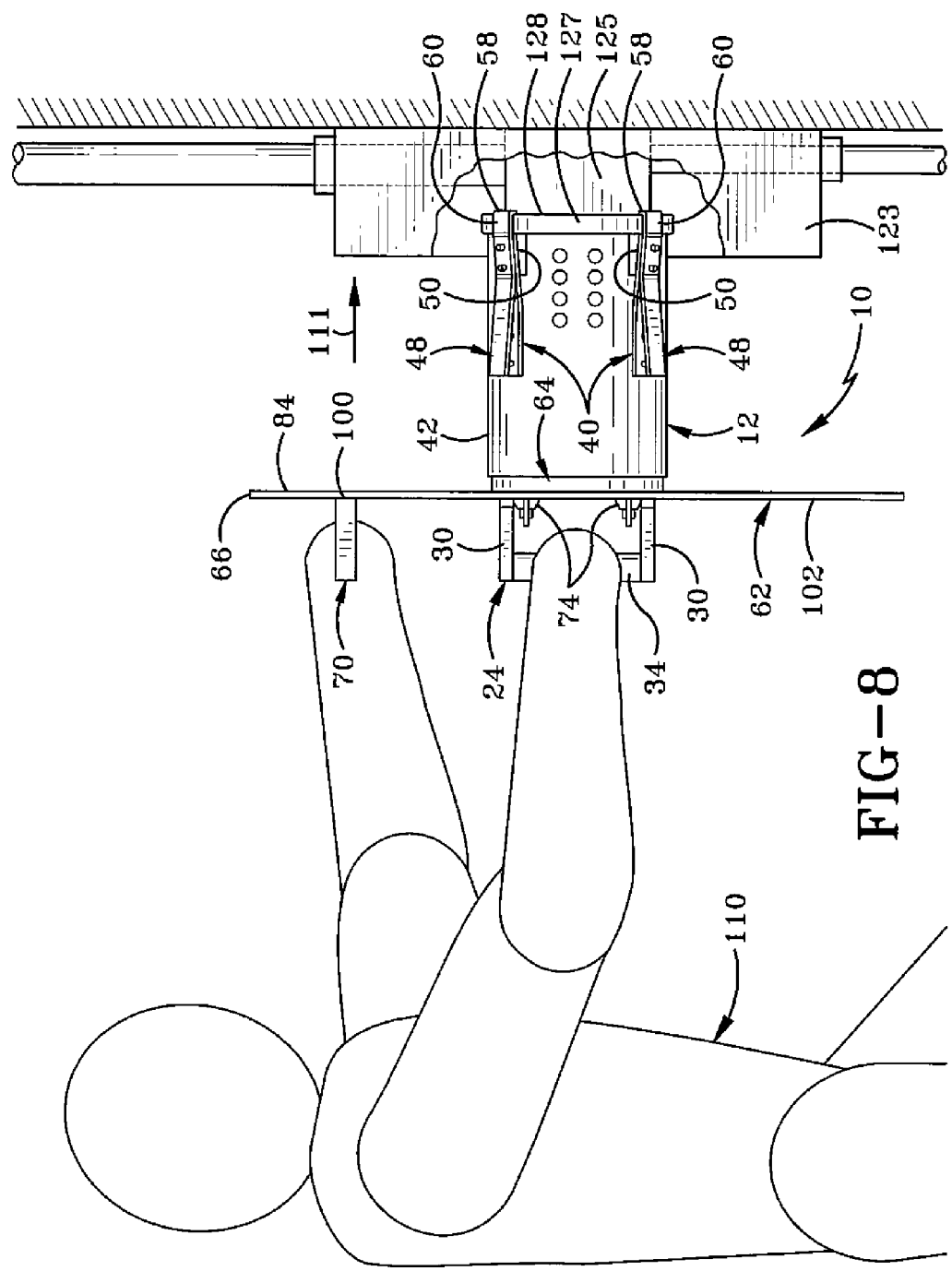
FIG. 8 is an operational view showing the installer forcing the sleeve member on to the power meter.
Figure 9:
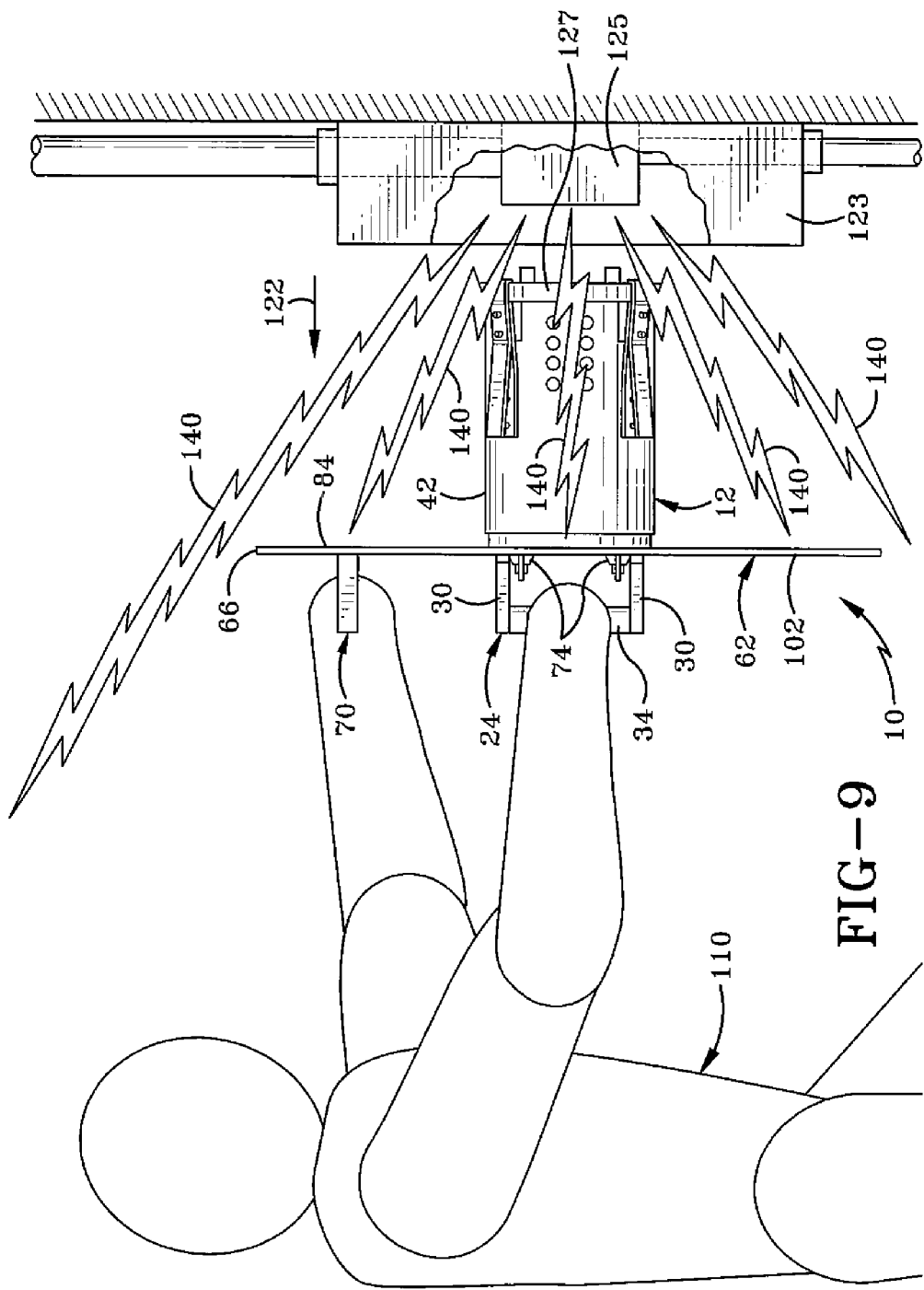
FIG. 9 is an operational view of the operator removing the power meter with the sleeve member and an electrical explosion being deflected around the safety shield.

FIGS. 7 through 9 illustrate the operation of the meter puller after shield 62 has been secured on intermediate member 64 and second end 16 as shown in FIGS. 3A, 3B, and 5. Referring now to FIG. 7, an operator 110 grasps tool 10 at handles 24 and 70 and forces the tool in a direction associated with arrow 111 towards electrical power meter 126 having a base 127. As seen in FIG. 8, the operator forces the tool in a direction associated with arrow 111 until hook portion 58 surrounds and contacts a back surface 128 of meter base 127 and engages the tool with the meter for removal.

FIG. 9 illustrates removal of the electrical meter by pulling tool 10 in direction associated with arrow 122 away from a distribution box 123 and particularly meter mount 125. Should an electrical explosion or electrocution occur during the removal of meter 126, a blast 140 will be sent towards the operator and deflected by shield 62 or, due to the size of the shield, pass radially outward of the shield and thereby missing the operator. Advantageously, this shield arrangement provides a greater cone of protection for the operator to reduce the risk and damage that a blast may cause during electrical power meter removal and installation. Still further, the shield provides greater dexterity for the user in that there are two handles to guide the tool on to the power meter as well as during the removal and installation process.

Alternatively, the operator may use a strap wrench or other suitable tool to compress angled portions 56 on each gripping hook 48. Advantageously, using a strap wrench allows the operator to compress the gripping hooks and surround the power meter while reducing the operator's risk of being electrocuted.

Thus, tool 10 provides an apparatus for protecting a user as well as additional assistance during the installation and removal of electrical power meters. Further, the tool is easily transportable as shield 62 may be easily removed to allow for storage. The shield provides a cone of protection with greater heat attenuation for the user with increasing the user's control over the meter puller by using two hands.

It will be evident to one of skilled in the art that a variety of changes can be made that are within the spirit and scope of the present invention. For instance, the sleeve member and shield may be composed of the same or different materials and can be manufactured of a variety of colors, including translucent colors. Further, the size of the shield and the length of the sleeve member may be adjusted to accommodate specific users or specific power meters.

In a second embodiment of the present invention, an enhanced meter puller 101 is shown in FIGS. 10-21, and described hereinafter.

Figure 10:
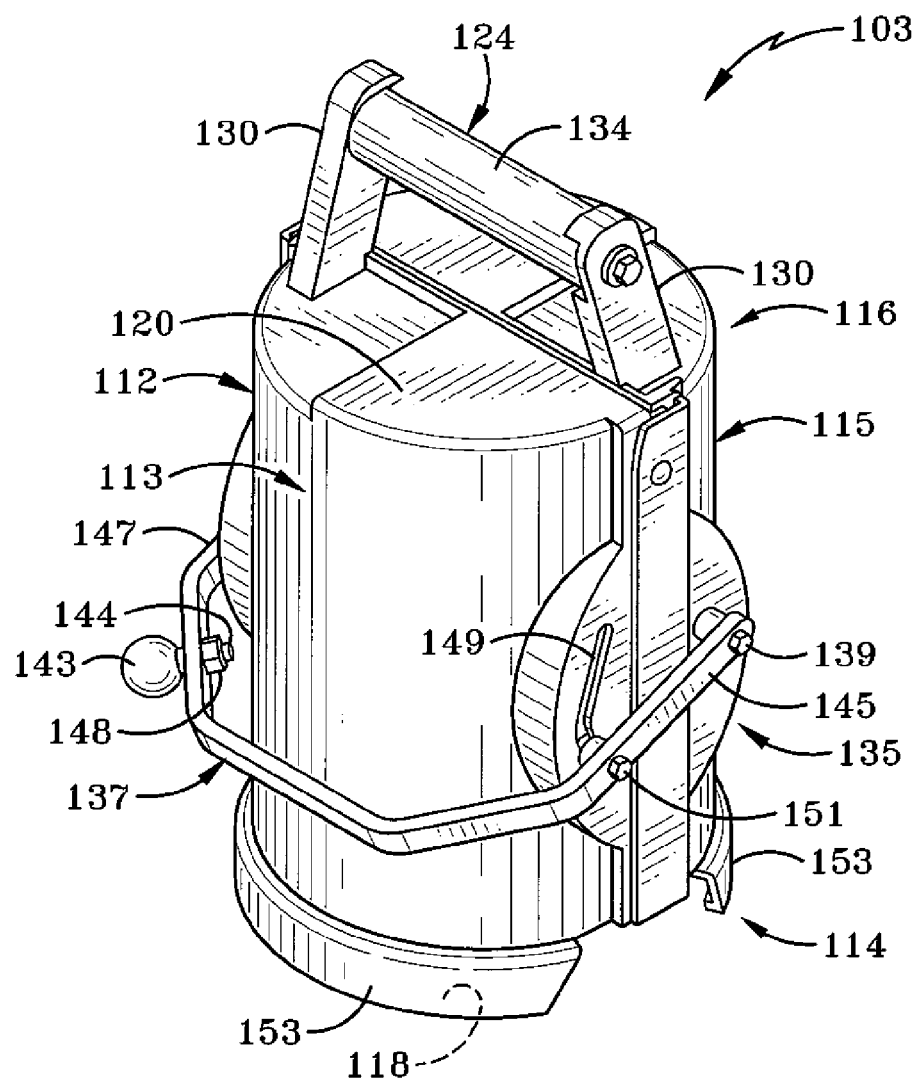
FIG. 10 is a perspective view of a sleeve member of a second embodiment of the invention with a clamping system for actuating a pair of lips to grip and release the meter.
Figure 14:
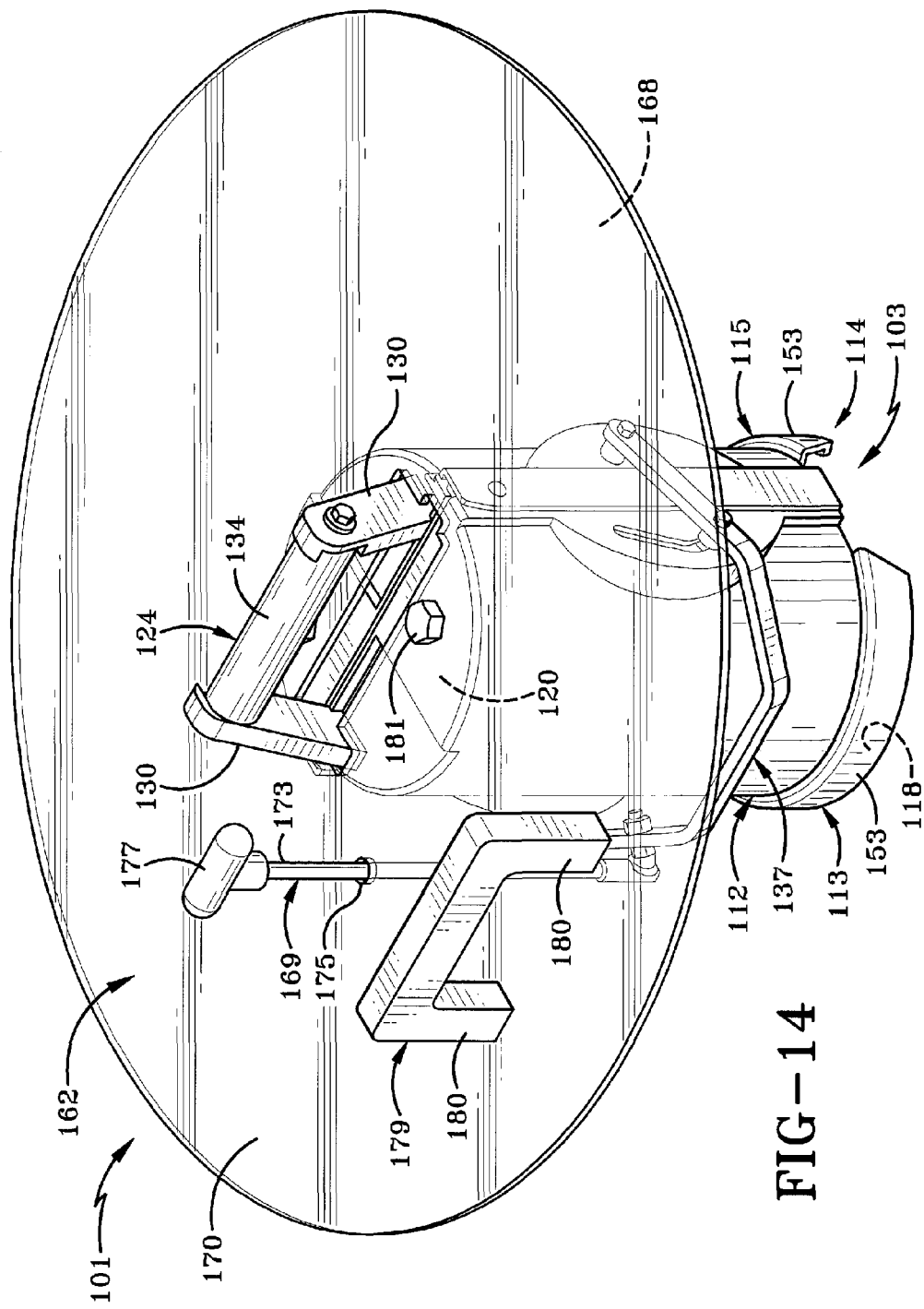
FIG. 14 is a perspective view of an enhanced meter puller of the present invention.

As shown in FIGS. 10 and 14, enhanced meter puller 101 includes a meter puller 103, which may be embodied by any common off-the-shelf meter puller. Shown particularly in FIG. 10, meter puller 103 includes a sleeve member 112 which extends from a first end 114 to a second end 116. First end 114 defines an opening 118, while a top surface 120 is disposed at second end 116. A pair of posts 130 extend outwardly away from top surface 120 and receive a central rod 134 therebetween to form a handle 124. Sleeve member 112 is comprised of a first sleeve portion 113 coupled with a second sleeve portion 115, wherein first sleeve portion 113 and second sleeve portion 115 are movable with respect to each other.

Figure 16:
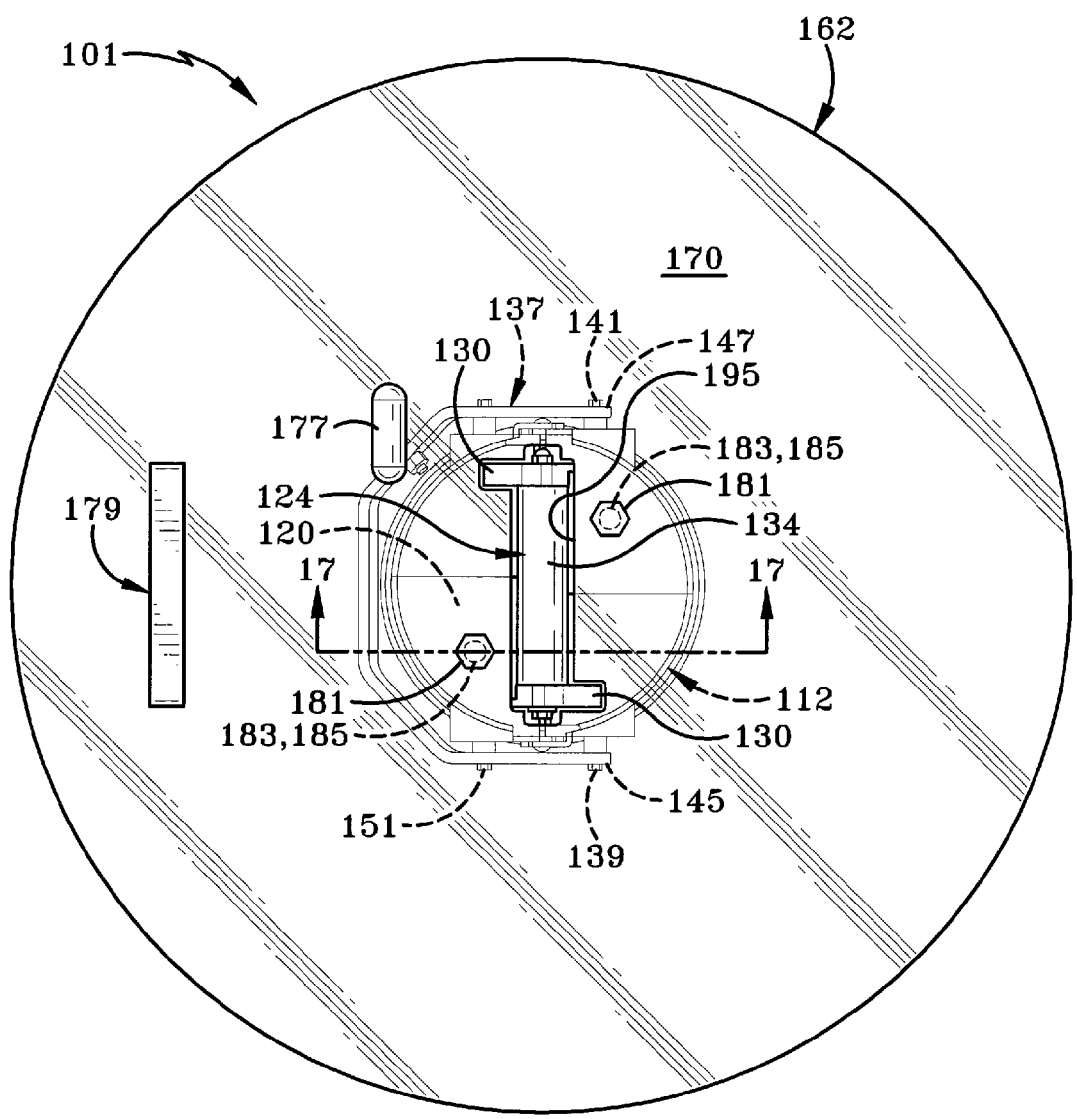
FIG. 16 is a top plan view of the enhanced meter puller.
Figure 18:
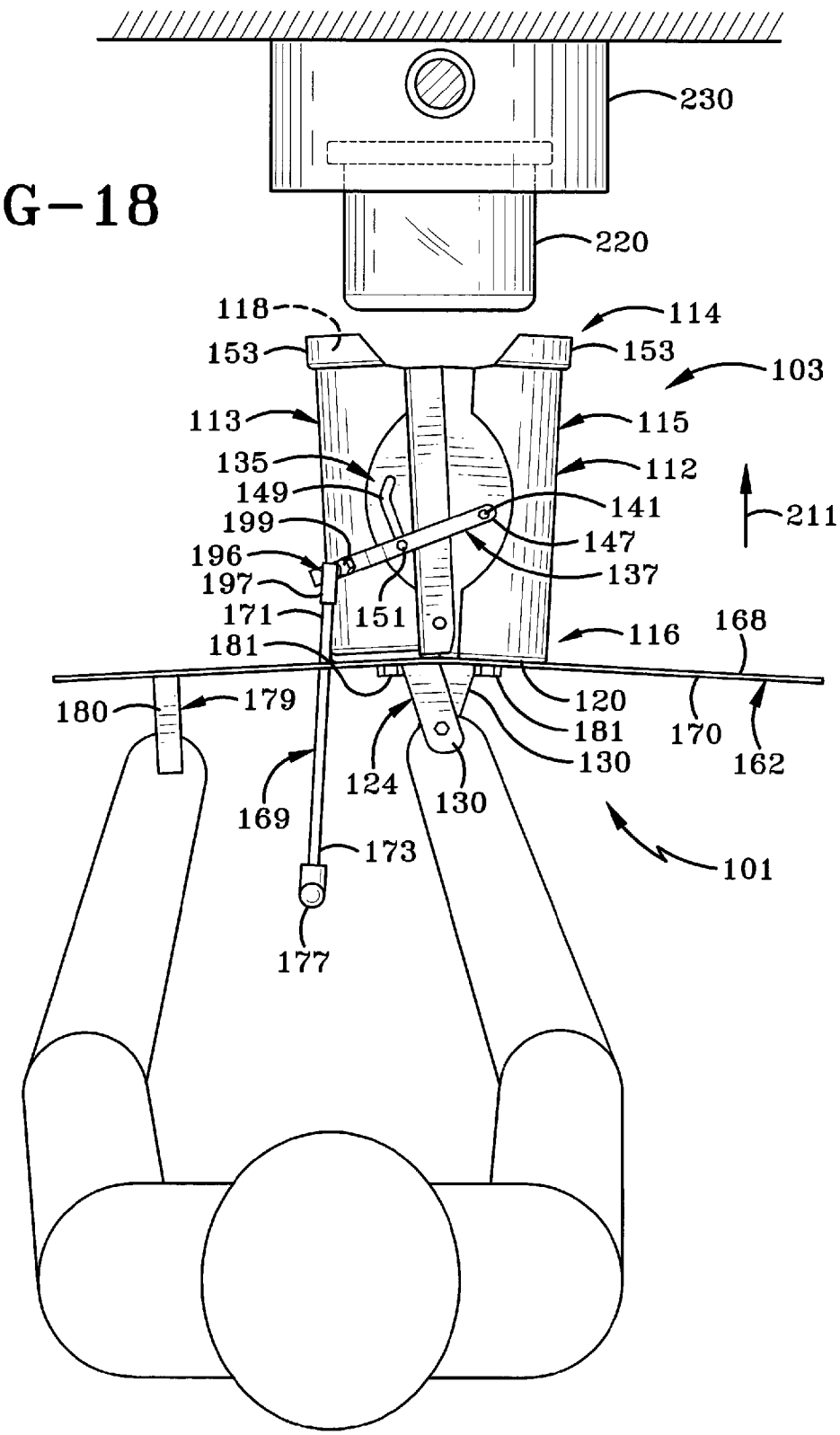
FIG. 18 is an operational view showing an operator gripping the handles of the enhanced meter puller and manually moving the enhanced meter puller towards a meter.

As shown in FIG. 10, meter puller 103 includes a locking mechanism or a clamping system, shown generally at 135. Clamping system 135 is intended to move first sleeve portion 113 and second sleeve portion 115 together and apart to clamp onto a meter for extraction. Clamping system 135 includes a cam arm 137 extending from a first end 145 to a second end 147. First end 145 is pivotably connected to second sleeve portion 115 by way of a pivot bolt 139, whereas second end 147 (FIG. 16) is pivotably connected to a distal portion of second sleeve portion 115 by way of a pivot bolt 141 (FIG. 16). Thus, cam arm 137 wraps entirely around first sleeve portion 113, and is pivotable from a first position (FIG. 10) to a second position (FIG. 18). A user generally actuates cam arm 137 by way of a knob 143 removably secured to cam arm 137 via a threaded member 144 (FIG. 11) extending into an aperture 146 (FIG. 11) defined by cam arm 137. Threaded member 144 is secured therein by way of a nut 148.

As shown in FIG. 10, clamping system 135 further includes a pair of cam tracks 149 defined by first sleeve portion 113. A corresponding pair of cam bolts 151 extend from cam arm 137 into cam tracks 149 to cammably connect first end 114 of sleeve member 112 to cam arm 137. It will readily be understood that by moving cam arm 137 from the first position to the second position, cam bolts 151 follow the orientation of cam tracks 149 in a camming manner to move first sleeve portion 113 in relation to second sleeve portion 115. This reduces the overall size of opening 118 when cam arm 137 is in the first position, and enlarges opening 118 when cam arm 137 is in the second position. Extending from each of first sleeve portion 113 and second sleeve portion 115 are a pair of corresponding lock lips 153, which generally surround opening 118. Those in the art will readily understand that cam arm 137 is moved from the second position to the first position to clamp lock lips 153 around a meter for extraction. Those in the art will readily understand that cam arm 137 is moved from the second position to the first position to clamp lock lips 153 around a meter for extraction. Pursuant to this, once lock lips 153 are clamped on a meter, the user then physically pulls meter puller 103 by way of handle 124 to remove the meter from the meter box.

Enhanced meter puller 101, the individual components, and the overall method for assembling the same will now be discussed. One of the primary features of enhanced meter puller 101 relates to applying a shield 162 to meter puller 103 for protecting the user. Pursuant to this, enhanced meter puller 101 provides a method for actuating clamping system 135 safely behind shield 162. Broadly speaking, shield 162 includes a first side 168 and an opposite second side 170. As shown in FIG. 14, first side 168 is sized and positioned to abut top surface 120 of sleeve member 112. A plurality of bolts 181 are provided and sized to fit through a corresponding plurality of bolt apertures 183 defined by shield 162 such that bolts 181 extend through the corresponding bolt apertures 183 and into sleeve member 112 to secure shield 162 thereto. As such, sleeve member 112 proximate second end 116 must provide a corresponding receiving hole 185 for receiving bolt 181 therein. Inasmuch as meter puller 103 may be provided as an off-the-shelf component, receiving holes 185 may not be provided at the outset. Thus, a template 165 is provided for ensuring receiving holes 185 align with bolt apertures 183.

Figure 12:
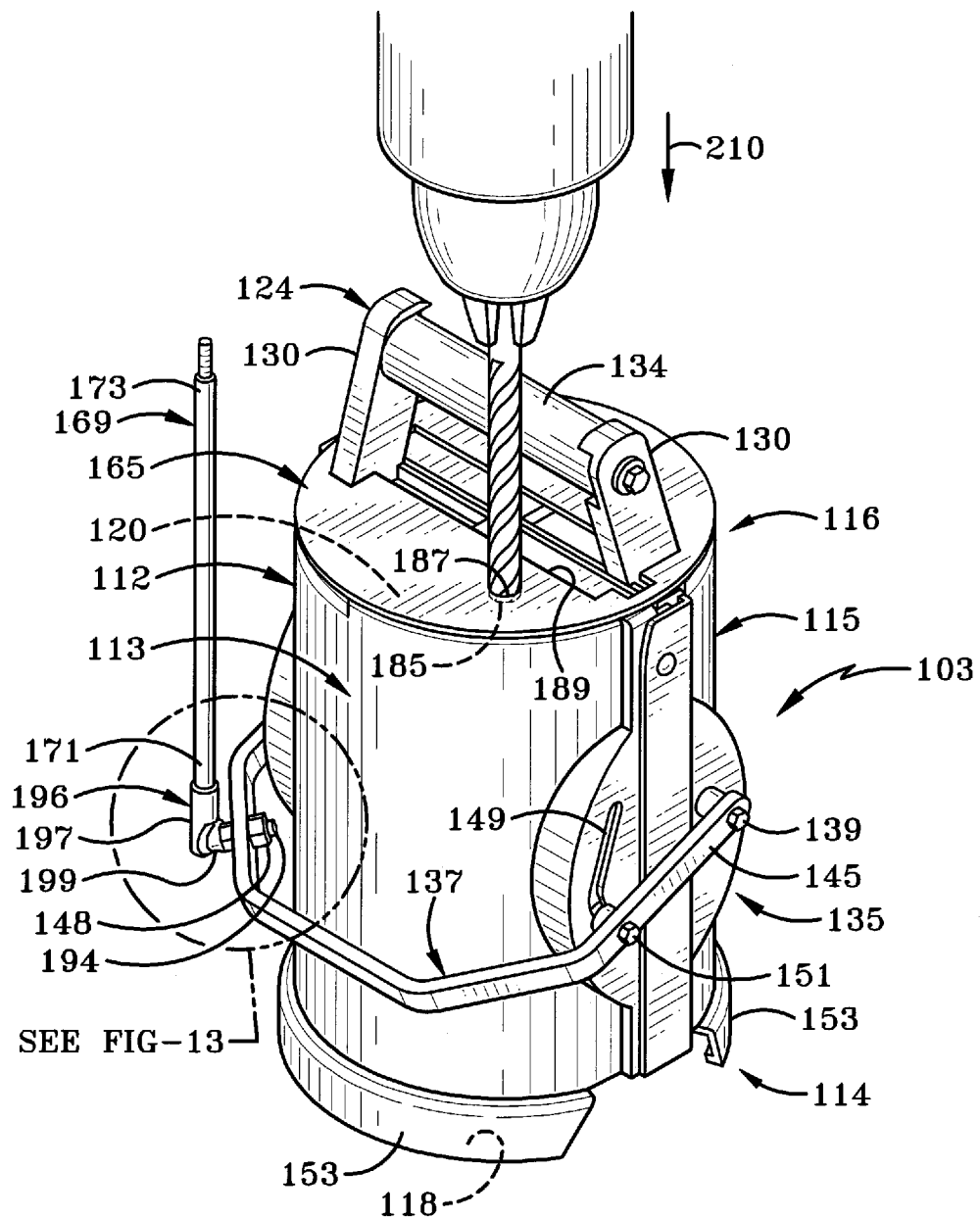
FIG. 12 is a perspective view of the sleeve member having a drill extending therein and an actuation device attached thereto.
Figure 15:
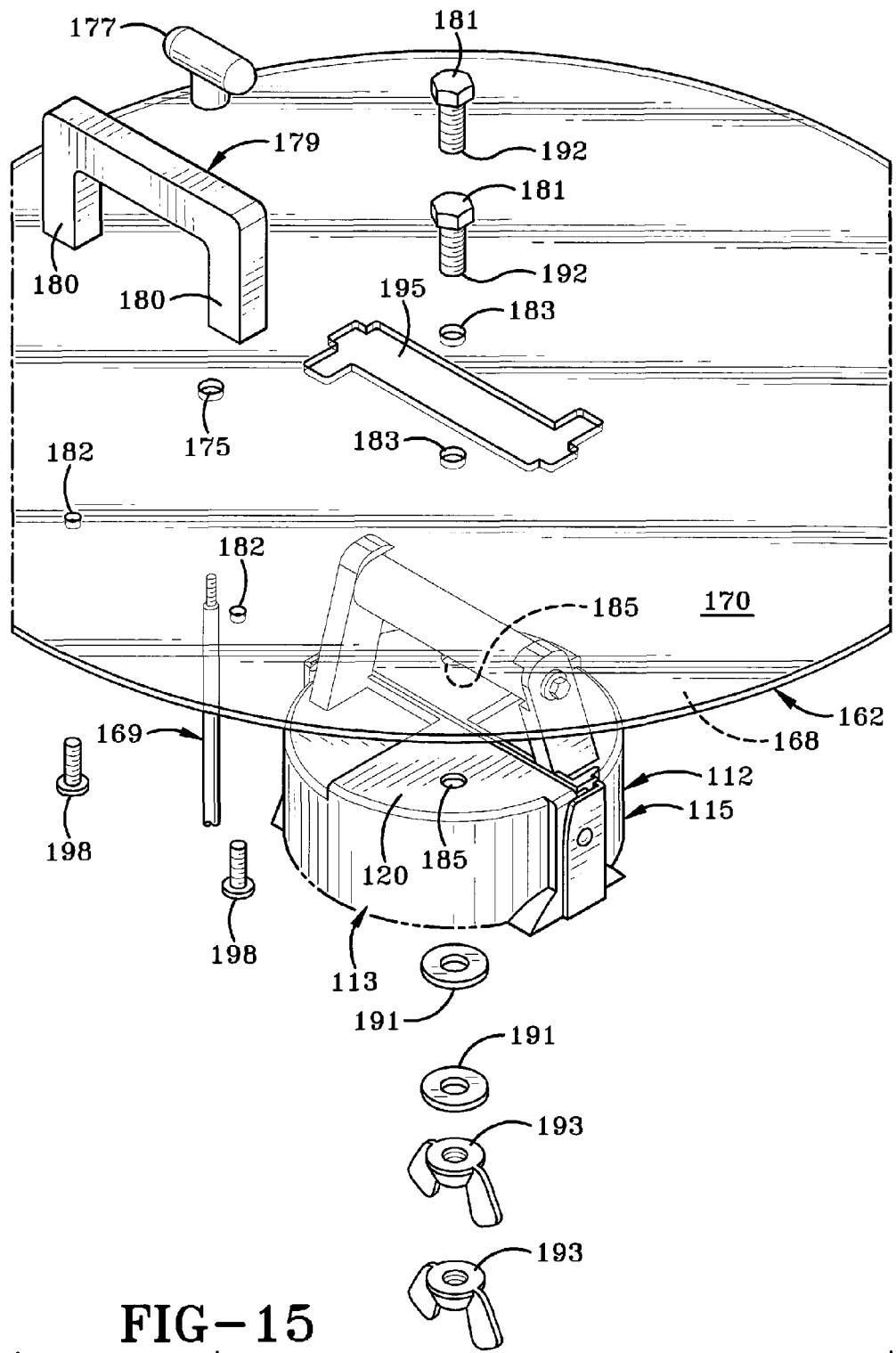
FIG. 15 is a partial exploded view of the enhanced meter puller of the present invention.
Figure 17:
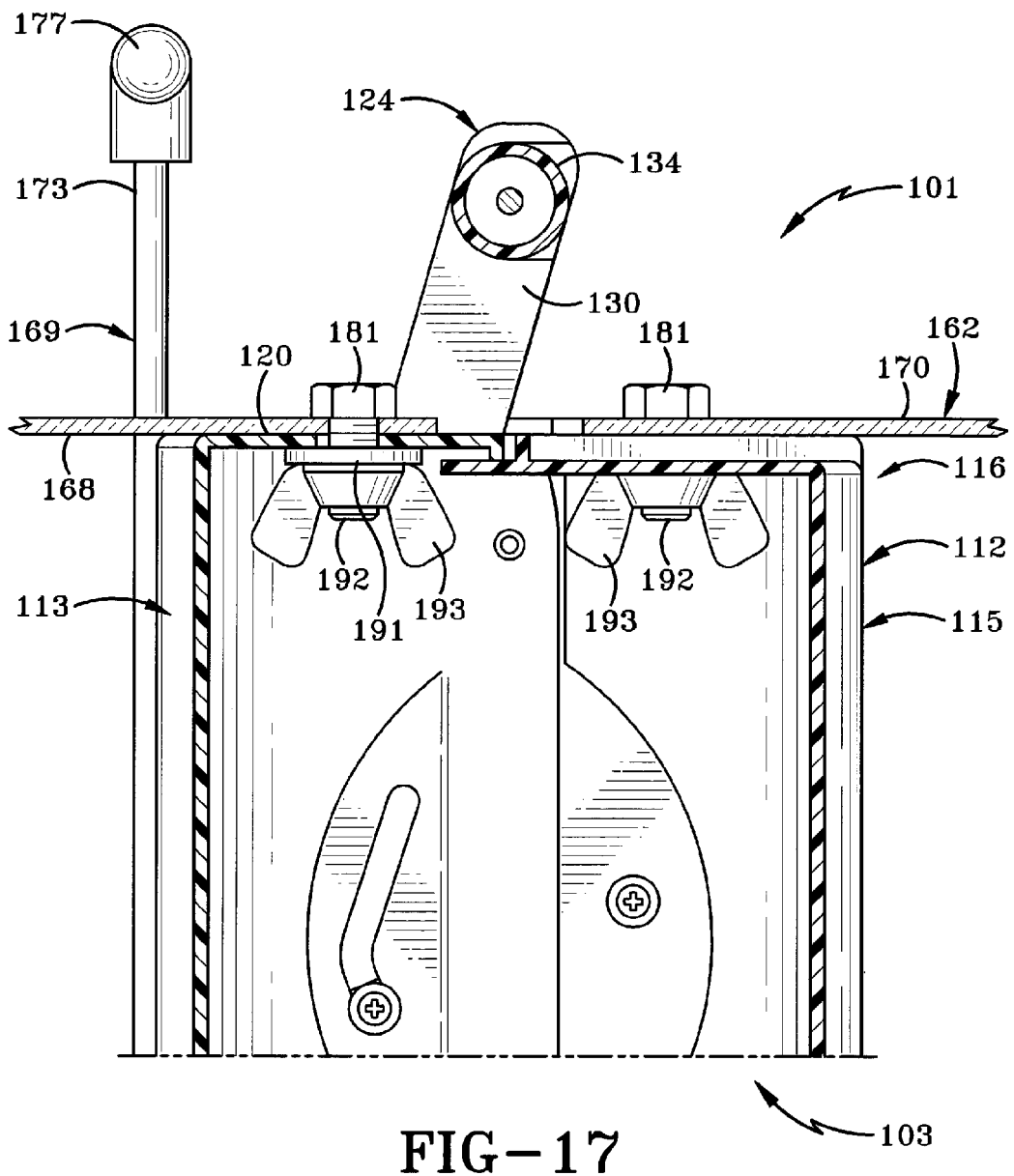
FIG. 17 is a partial cross-sectional view of the enhanced meter puller taken generally about Line 17-17 of FIG. 16.

Template 165 is provided with a plurality of drill apertures 187 as well as a handle aperture 189. As such, the user may extend template 165 onto second end 116 of sleeve member 112 such that template 165 abuts top surface 120. It will be readily understood that handle aperture 189 is sized and shaped to receive handle 124 therethrough for allowing template 165 to extend down into an abutting relationship with top surface 120. As shown in FIG. 12, the user then extends a drill through drill apertures 187 and into sleeve member 112 such that receiving holes 185 are formed thereby, and in correct alignment with bolt apertures 183. Thereafter, template 165 is removed and shield 162 is lowered onto top surface 120 such that bolt apertures 183 align with receiving holes 185, which allows the user to extend bolts 181 through both bolt apertures 183 and receiving holes 185. As shown in FIGS. 15 and 17, a free end 192 of each bolt 181 is thereby positioned within sleeve member 112 proximate second end 116. Thereafter, the user then applies a washer 191 and a wing nut 193 onto free end 192 to secure bolts 181 and lock shield 162 onto meter puller 103. As shown in FIG. 15, shield 162 further includes a handle aperture 195 which is particularly sized and shaped to align handle 124 to pass therethrough, thus allowing shield 162 to tightly abut top surface 120. One will readily understand that handle aperture 195, handle aperture 189, and other related components of enhanced meter puller 101 may be sized and shaped differently to accommodate different meter pullers 103 in general, and in particular, different second ends 116 of sleeve member 112.

As shown in FIG. 15, enhanced meter puller 101 further includes a brace handle 179 for providing additional handle for use by the user in manually pulling the enhanced meter puller 101, and physically manipulating the overall structure. Brace handle 179 is formed in an overall C-shaped structure having a pair of legs 180 which extend to align with a corresponding pair of handle apertures 182 defined by shield 162 and particularly positioned such that a corresponding pair of handle bolts 198 extend therethrough to secure brace handle 179 to shield 162, as shown in FIGS. 14 and 18. As such, brace handle 179 extends upwardly away from second side 170 of shield 162. Thus, the user enjoys both handle 124 as provided by meter puller 103, as well as brace handle 179 as provided by enhanced meter puller 101 for use in manually manipulating the overall structure of enhanced meter puller 101, particularly when clamping system 135 is clamped onto a meter.

Figure 11:
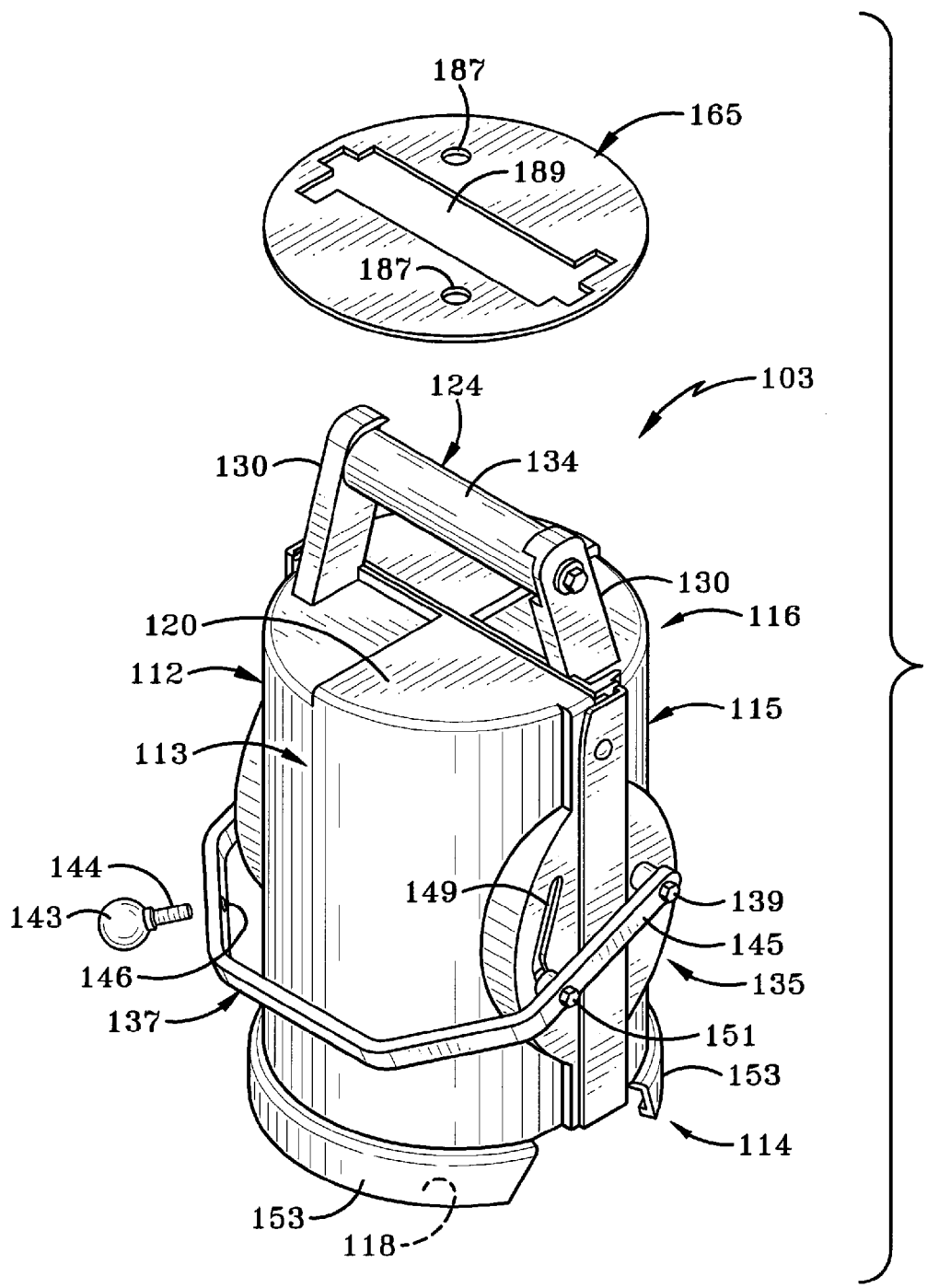
FIG. 11 is an exploded view of the sleeve member shown with a template.
Figure 13:
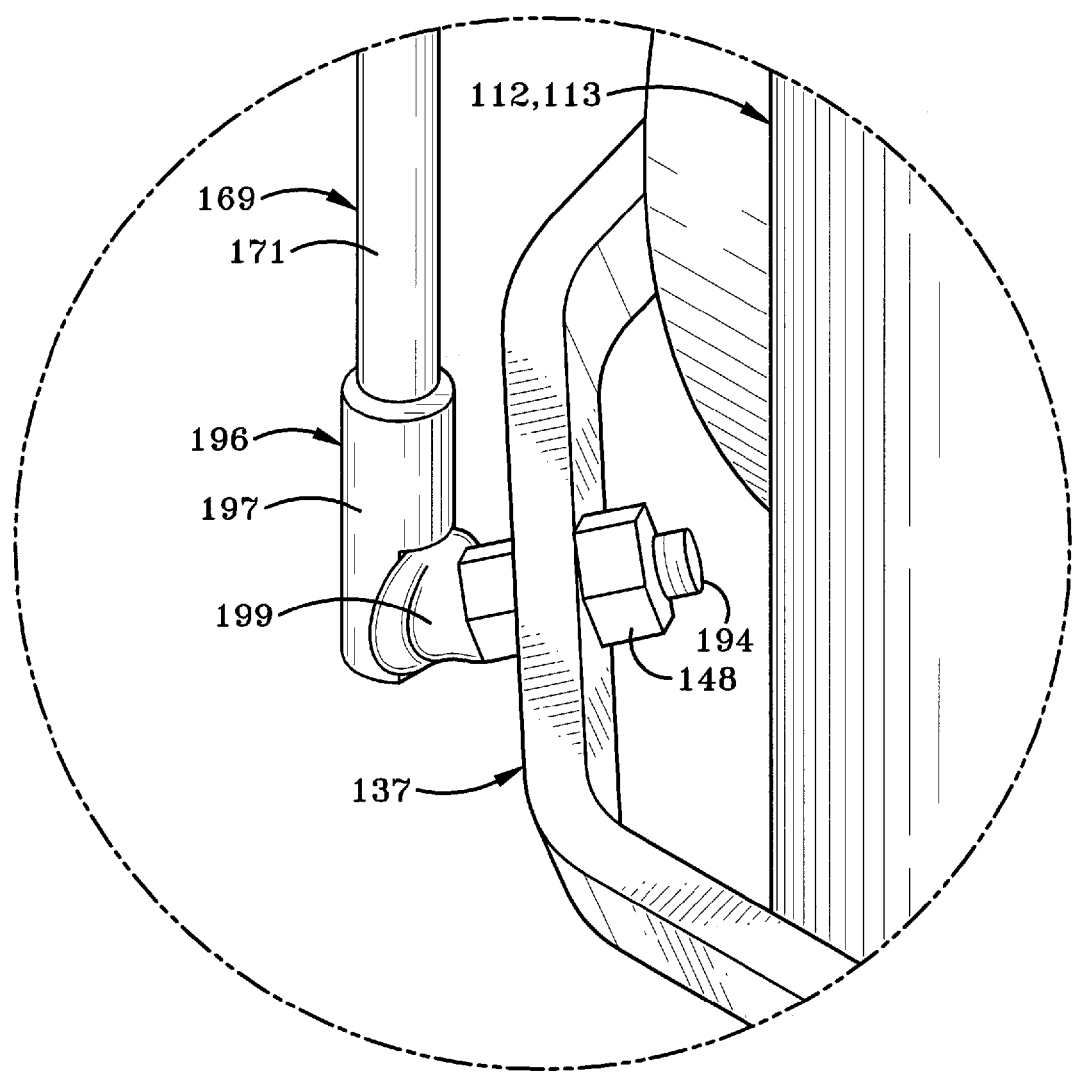
FIG. 13 is an enlarged view of a portion of FIG. 12.

It is a primary feature of the present invention that a user of enhanced meter puller 101 may actuate clamping system 135 from behind the relative safety of second side 170 of shield 162. Thus, the physical manipulation of enhanced meter puller 101, as well as the actuation of clamping system 135 may be done entirely behind shield 162. Pursuant to this, shield 162 defines aperture 175 which is positioned purposely to align an actuation device 169 with cam arm 137, as shown in FIG. 14. As shown in FIG. 12, actuation device 169 includes a first portion 171 and a second portion 173. As shown in FIG. 14, first portion 171 is sized and shaped to be extended through aperture 175 and disposed proximate cam arm 137. As shown in FIG. 13, a bracket 196 is provided to pivotally secure first portion 171 of actuation device 169 to cam arm 137. Bracket 196 includes a receiving sleeve for receiving first portion 171 of actuation device 169 therein. Bracket 196 further includes a pivot element 199 for allowing receiving sleeve 197 to pivot while first portion 171 is secured therein. A shaft 194 extends from pivot element 199 and receiving sleeve 197, and is sized and shaped to extend through aperture 146 defined by cam arm 137 (FIG. 11). Thereafter, nut 148 or alternatively, an additional nut is secured to shaft 194 to firmly secure shaft 194 and the overall bracket 196 onto cam arm 137 in a pivotable manner. As shown in FIG. 14, second portion 173 of actuation device 169 thereafter extends through aperture 175 and outwardly away from second side 170 of shield 162 such that an actuation handle 177 may be applied thereon. In accordance with the pivoting nature of cam arm 137 and overall clamping system 135, the user may thereafter push and pull actuation handle 177 to move cam arm 137 between the first position (FIG. 19) and the second position (FIG. 18). Aperture 175 is sized to allow a reasonably tight fit around actuation device 169 such that the pushing and pulling on handle 177 generally in a linear nature towards and away from shield 162. One will readily recognize that manually manipulating handle 177 in a linear manner corresponds to manually manipulating cam arm 137 in a linear manner. However, manipulating actuation handle 177 is done from a safe position behind shield 162, thereby drastically reducing the chance that a user will be harmed by an explosion or an electrical discharge from the meter while the meter is being removed. This represents an enormous leap in the field in terms of safety as well as efficiency, as it will be readily understood that shield 162 may be retroactively applied to preexisting off-the-shelf meter pullers 103. Thus, the overall expense of providing the user with improved safety is relatively minor.

The overall size of shield 162 may differ, however, in the preferred embodiment, the overall diameter or cross-sectional size of shield 162 is preferably at least 50% larger than the overall diameter of second end 116 of sleeve member 112. This provides the user with an extended shielding while manually manipulating meter puller 103. Likewise, shield 162 may be manufactured using any common components. However, shield 162 is preferably constructed using a dielectric or insulating material such that electricity may be dissipated efficiently without harming the user.

A user may receive the elements for forming enhanced meter puller 101 as a kit or aftermarket addition for standard off-the-shelf meter pullers, similar to meter puller 103. Alternatively, it is within the scope of the invention to provide enhanced meter puller 101 in a fully assembled state, having the shield secured onto a sleeve member for sale as a single unit.

In operation, the user or assembler is presented with meter puller 103 and the elements for assembling enhanced meter puller 101 and begins forming enhanced meter puller 101 by abutting template 165 to top surface 120 of sleeve member 112. This allows the user to align drill apertures 187 on template 165 with the areas on top surface 120 for forming receiving holes 185. As shown in FIG. 12, the user drills through template 165 and drill apertures 187 into sleeve member 112 to form receiving holes 185 therein.

One will readily understand that the drilling is generally undertaken in the direction of Arrow 210 to penetrate through template 165 and into sleeve member 112. Thereafter, the user then removes knob 143 from cam arm 137 to expose aperture 146 for attachment with first portion 171 of actuation device 169. Shaft 194 on bracket 196 is extended through aperture 146 and secured therein by way of nut 148 or a similar element such that actuation device 169 is pivotable to move cam arm between the first position and the second position as desired by the user. As shown in FIG. 15, thereafter, the user then extends shield 162 such that handle 124 extends through aperture 195 allowing first side 168 of shield 162 to abut top surface 120 of sleeve member 112. Inasmuch as bolt apertures 183 and receiving holes 185 are aligned, free end 192 of bolts 181 extend through each of these openings and into the interior of sleeve member 112, where each free end 192 is secured by any means in the art. Particularly, as shown in FIG. 15, free end 192 is secured therein by washer 191 and wing nut 193 threadably received thereon. Concurrent to this, second portion 193 of actuation device 169 extends through aperture 175 to extend outwardly away from second side 170 of shield 162. The user then screws or adheres actuation handle 177 onto second portion 173 of actuation device 169. Thereafter, the user then secures brace handle 179 to shield 162 by way of handle bolts 198 extending through handle apertures 182 and into each of the pair of legs 180. Thus, enhanced meter puller 101 is shown in the fully assembled state in FIG. 14.

Figure 19:
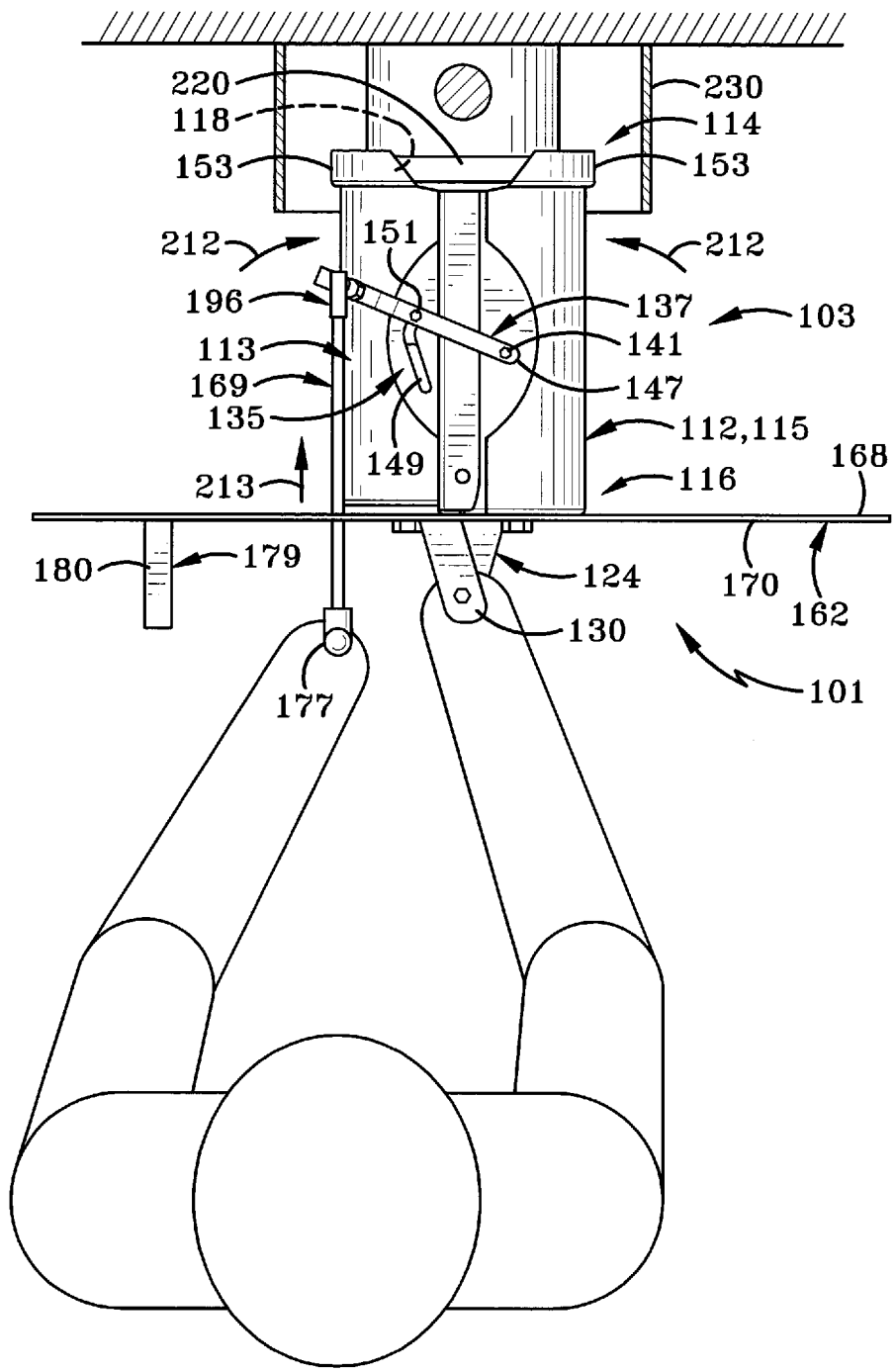
FIG. 19 is an operational view showing an operator actuating a clamping system of the meter puller from behind the shield.
Figure 20:
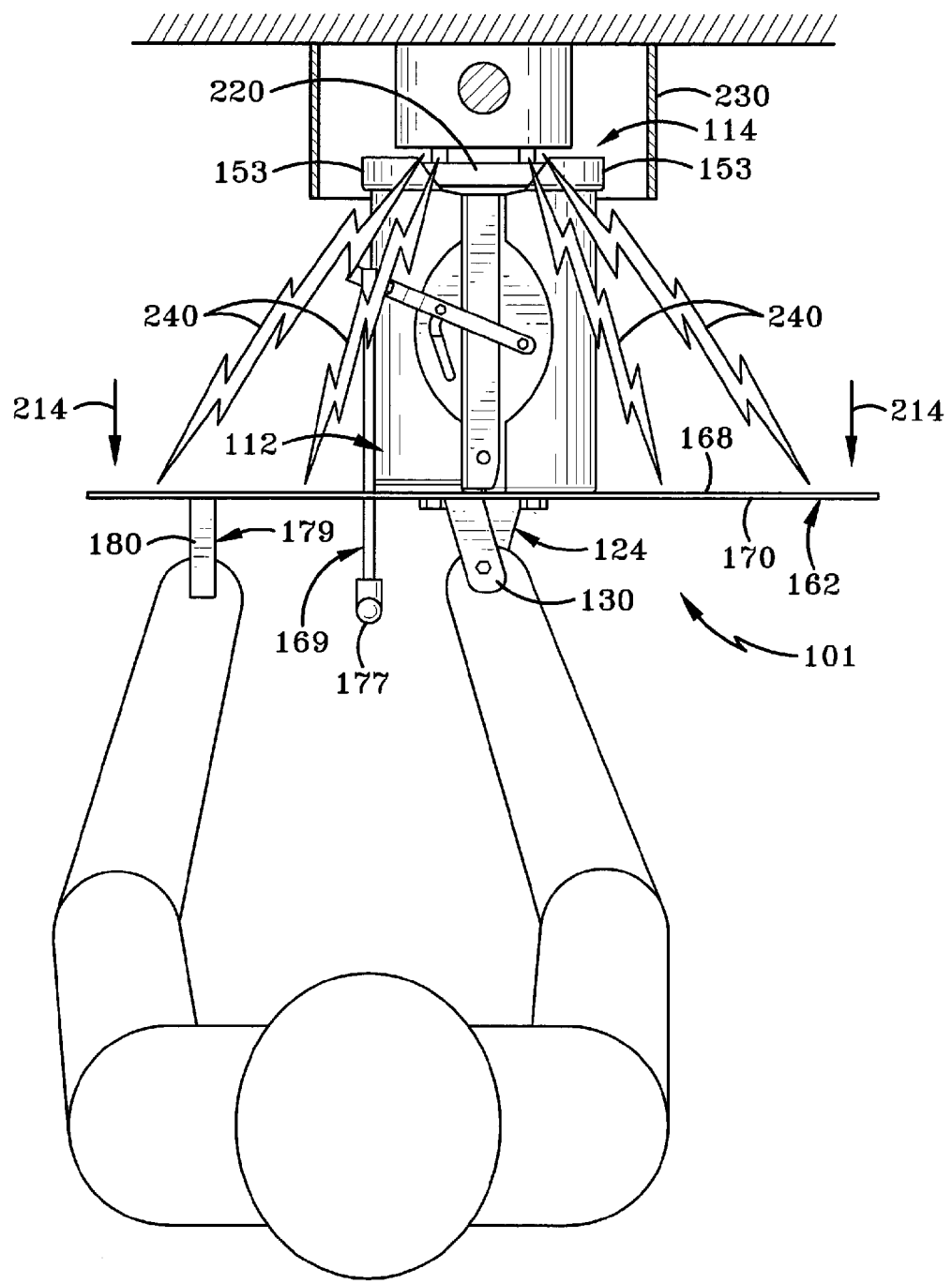
FIG. 20 is an operational view of the operator removing the meter using the enhanced meter puller and an electrical explosion being deflected around the shield.

As shown in FIGS. 18-20, enhanced meter puller 101 is then useable to provide a safe method for removing a meter disposed in an electrical box. As shown in FIG. 18, the method for removing a meter 220 from an electrical box 230 is shown in the initial stages. Meter 220 is interconnected with electrical box 230, and is in need of removal. To initiate removing meter 220, the user ensures that meter puller 103 is in the second or opened position. This requires cam arm 137 to be fully retracted towards the user with cam bolts 151 closest to the user. In this orientation, lock lips 153 are in a fully opened and extended position with opening 118 having its largest diameter. As one can readily ascertain from viewing FIG. 18, the user is positioned behind shield 162 such that shield 162 is intermediate the user and the meter 220. The user then moves enhanced meter puller 101 in the direction of Arrow 211 to plunge meter 220 into the interior of sleeve member 112. As shown in FIG. 19, the user then pushes actuation handle 177 towards meter 220 to articulate actuation device 169 such that cam arm 137 moves forward or away from the user to transition meter puller 103 into the first or closed position. Likewise, this movement of cam arm 137 retracts lock lips 153 in the directions of Arrows 112 to lock puller 103 onto meter 220. Clamping system 135 is engaged and moved by the user safely behind shield 162. Therefore, any electrical discharge or explosion will be deflected by shield 162 away from and around the user.

As shown in FIG. 20, after the user locks meter puller 103 onto meter 220 by actuating clamping system 135 from safely behind shield 162, the user then grasps enhanced meter puller 101 by handle 124 and brace handle 179 to allow the user to manually manipulate and pull enhanced meter puller 101 in the direction of Arrows 214 to thereby remove meter 220 from electrical box 230. As shown in FIG. 20, in the event there is an electronic discharge or explosion 240, the user remains safely behind shield 162 and proximate second side 170 throughout the entire operation of using enhanced meter puller 101 to remove meter 220 from electrical box 230.

Accordingly, the power meter puller with safety shield is an effective, safe, inexpensive, and efficient device that achieves all the enumerated objectives of the invention, provides for eliminating difficulties encountered with prior art devices, systems, and methods, and solves problems and obtains new results in the art.

In the foregoing description, certain terms have been used for brevity, clearness, and understanding; but no unnecessary limitations are to be implied therefrom beyond the requirement of the prior art, because such terms are used for descriptive purposes and are intended to be broadly construed.

Moreover, the description and illustration of the invention is by way of example, and the scope of the invention is not limited to the exact details shown or described.

Having now described the features, discoveries, and principles of the invention, the manner in which the power meter puller with safety shield is constructed and used, the characteristics of the construction, and the advantageous new and useful results obtained; the new and useful structures, devices, elements, arrangement, parts, and combinations are set forth in the appended claims.

The invention claimed is:

1. A method of enhancing a meter puller having a clamping system movable between a clamped position and an unclamped position, the method comprising the steps of:
   attaching a shield to the meter puller;
   extending a first portion of an actuation device through an aperture defined by the shield;
   connecting the first portion of the actuation device to the clamping system; and
   actuating a second portion of the actuation device to move the clamping system between the clamped position and the unclamped position.

2. The method of claim 1, further comprising the steps of:
   attaching an actuation handle to the second portion of the actuation device; and
   actuating the actuation handle to move the clamping system between the clamped position and unclamped position.

3. The method of claim 1, further comprising the step of disposing a brace handle on the shield.

4. The method of claim 3, further comprising the steps of:
   extending an integrated handle on the meter puller through a handle aperture defined by the shield; and
   allowing a user to grasp the integrated handle and the brace handle to manipulate the meter puller.

5. The method of claim 4, wherein the user manipulates the meter puller on an opposite side of the shield from the meter puller.

6. The method of claim 1, further comprising the steps of:
   removing a knob from a knob portion of the clamping system; and
   connecting the first portion of the actuation device to the knob portion.

7. The method of claim 6, further comprising the step of connecting the knob to the second portion of the actuation device to form an actuation handle.

8. The method of claim 1, further comprising the steps of extending at least one bolt through the shield and the meter puller to secure the shield to the meter puller.

9. The method of claim 8, further comprising the steps of:
   forming at least one first bolt aperture on the meter puller for receiving the at least one bolt therethrough to secure the shield to the meter puller; and
   forming at least one second bolt aperture on the shield for receiving the at least one bolt therethrough to secure the shield to the meter puller.

10. The method of claim 9, further comprising the step of abutting a template with the meter puller to identify where to form the at least one first bolt aperture on the meter puller.

* * * * *